(12) United States Patent
Peterson et al.

(10) Patent No.: US 6,921,860 B2
(45) Date of Patent: Jul. 26, 2005

(54) MICROELECTRONIC COMPONENT ASSEMBLIES HAVING EXPOSED CONTACTS

(75) Inventors: Darin L. Peterson, Boise, ID (US); Richard W. Wensel, Boise, ID (US); Choon Kuan Lee, Singapore (SG); James A. Faull, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 174 days.

(21) Appl. No.: 10/391,725

(22) Filed: Mar. 18, 2003

(65) Prior Publication Data

US 2004/0188123 A1 Sep. 30, 2004

(51) Int. Cl.[7] .............................................. H01L 23/552
(52) U.S. Cl. ................................ 174/52.2; 228/180.22; 257/780; 264/372.11
(58) Field of Search ................... 174/52.2; 228/180.22; 257/738, 780, 787; 264/372.11

(56) References Cited

U.S. PATENT DOCUMENTS

| | | | |
|---|---|---|---|
| 4,862,245 A | 8/1989 | Pashby et al. | |
| 5,173,220 A | 12/1992 | Reiff et al. | |
| 5,209,390 A | * 5/1993 | Temple et al. | 228/180.22 |
| 5,264,061 A | 11/1993 | Juskey et al. | |
| 5,278,442 A | 1/1994 | Prinz et al. | |
| 5,304,842 A | 4/1994 | Farnworth et al. | |
| 5,363,279 A | 11/1994 | Cha | |
| 5,436,500 A | 7/1995 | Park et al. | |
| 5,477,086 A | * 12/1995 | Rostoker et al. | 257/780 |
| 5,484,314 A | 1/1996 | Farnworth | |
| 5,551,148 A | * 9/1996 | Kazui et al. | 228/180.22 |
| 5,593,927 A | 1/1997 | Farnworth et al. | |
| 5,663,593 A | 9/1997 | Mostafazadeh et al. | |
| 5,677,566 A | 10/1997 | King et al. | |
| 5,677,576 A | 10/1997 | Akagawa | |
| 5,684,330 A | 11/1997 | Lee | |
| 5,696,033 A | 12/1997 | Kinsman | |
| 5,705,117 A | 1/1998 | O'Conner et al. | |
| 5,739,585 A | 4/1998 | Akram et al. | |
| D394,844 S | 6/1998 | Farnworth et al. | |
| 5,786,626 A | 7/1998 | Brady et al. | |
| 5,814,265 A | 9/1998 | Hull | |
| D402,638 S | 12/1998 | Farnworth et al. | |
| 5,851,845 A | 12/1998 | Wood et al. | |
| 5,863,812 A | 1/1999 | Manteghi | |

(Continued)

FOREIGN PATENT DOCUMENTS

| | | |
|---|---|---|
| WO | WO 02/24391 A1 | 3/2002 |
| WO | WO 02/27363 A2 | 4/2002 |

OTHER PUBLICATIONS

U.S. Appl. No. 09/651,930, filed Aug. 31, 2000, Akram.
U.S. Appl. No. 09/589,841, filed Jun. 8, 2000, Farnworth et al.

(Continued)

*Primary Examiner*—Dean A. Reichard
*Assistant Examiner*—Adolfo Nino
(74) *Attorney, Agent, or Firm*—Perkins Coie LLP

(57) ABSTRACT

The present disclosure suggests various microelectronic component assembly designs and methods for manufacturing microelectronic component assemblies. In one particular implementation, a microelectronic component includes an array of spaced-apart dams, each of which is associated with and circumscribes an open contact volume associated with one of the contacts. A dielectric material may cover the portion of the microelectronic component active surface that is external to the dams and extend between the spaced-apart dams.

63 Claims, 10 Drawing Sheets

U.S. PATENT DOCUMENTS

| | | | |
|---|---|---|---|
| 5,869,905 A | 2/1999 | Takebe | |
| 5,891,753 A | 4/1999 | Akram | |
| 5,892,288 A | 4/1999 | Muraki et al. | |
| 5,893,726 A | 4/1999 | Farnworth et al. | |
| 5,894,107 A | 4/1999 | Lee et al. | |
| 5,898,224 A | 4/1999 | Akram | |
| 5,907,477 A * | 5/1999 | Tuttle et al. | 174/52.2 |
| 5,933,713 A | 8/1999 | Farnworth | |
| 5,938,956 A | 8/1999 | Hembree et al. | |
| 5,958,100 A | 9/1999 | Farnworth et al. | |
| 5,965,933 A | 10/1999 | Young et al. | |
| 5,986,209 A | 11/1999 | Tandy | |
| 5,989,941 A | 11/1999 | Wensel | |
| 5,990,566 A | 11/1999 | Farnworth et al. | |
| 5,994,784 A | 11/1999 | Ahmad | |
| RE36,469 E | 12/1999 | Wood et al. | |
| 5,999,413 A | 12/1999 | Ohuchi et al. | |
| 6,008,070 A | 12/1999 | Farnworth | |
| 6,008,074 A | 12/1999 | Brand | |
| 6,020,629 A | 2/2000 | Farnworth et al. | |
| 6,025,728 A | 2/2000 | Hembree et al. | |
| 6,028,354 A | 2/2000 | Hoffman | |
| 6,028,356 A | 2/2000 | Kimura | |
| 6,028,365 A | 2/2000 | Akram et al. | |
| 6,046,496 A | 4/2000 | Corisis et al. | |
| 6,048,744 A | 4/2000 | Corisis et al. | |
| 6,048,755 A | 4/2000 | Jiang et al. | |
| 6,049,125 A | 4/2000 | Brooks et al. | |
| 6,060,768 A | 5/2000 | Hayashida et al. | |
| 6,072,236 A | 6/2000 | Akram et al. | |
| 6,075,288 A | 6/2000 | Akram | |
| 6,084,781 A * | 7/2000 | Klein | 228/180.22 |
| 6,097,082 A | 8/2000 | Sato | |
| 6,097,087 A | 8/2000 | Farnworth et al. | |
| 6,103,547 A | 8/2000 | Corisis et al. | |
| 6,107,109 A | 8/2000 | Akram et al. | |
| 6,107,122 A | 8/2000 | Wood et al. | |
| 6,107,680 A | 8/2000 | Hodges | |
| 6,117,382 A | 9/2000 | Thummel | |
| 6,124,634 A | 9/2000 | Akram et al. | |
| 6,150,717 A | 11/2000 | Wood et al. | |
| 6,159,764 A | 12/2000 | Kinsman et al. | |
| 6,172,419 B1 | 1/2001 | Kinsman | |
| 6,184,465 B1 | 2/2001 | Corisis | |
| 6,198,172 B1 | 3/2001 | King et al. | |
| 6,208,519 B1 | 3/2001 | Jiang et al. | |
| 6,210,992 B1 | 4/2001 | Tandy et al. | |
| 6,215,175 B1 | 4/2001 | Kinsman | |
| 6,221,697 B1 | 4/2001 | Su et al. | |
| 6,228,548 B1 | 5/2001 | King et al. | |
| 6,229,202 B1 | 5/2001 | Corisis | |
| 6,246,108 B1 | 6/2001 | Corisis et al. | |
| 6,251,488 B1 | 6/2001 | Miller et al. | |
| 6,252,308 B1 | 6/2001 | Akram et al. | |
| 6,258,624 B1 | 7/2001 | Corisis | |
| 6,259,153 B1 | 7/2001 | Corisis | |
| 6,259,962 B1 | 7/2001 | Gothait | |
| 6,268,584 B1 | 7/2001 | Keicher et al. | |
| 6,277,671 B1 | 8/2001 | Tripard | |
| 6,281,046 B1 * | 8/2001 | Lam | 257/738 |
| 6,284,571 B1 | 9/2001 | Corisis et al. | |
| 6,288,905 B1 | 9/2001 | Chung | |
| 6,291,894 B1 | 9/2001 | Farnworth et al. | |
| 6,294,839 B1 | 9/2001 | Mess et al. | |
| 6,303,981 B1 | 10/2001 | Moden | |
| 6,303,985 B1 | 10/2001 | Larson et al. | |
| 6,306,752 B1 | 10/2001 | DiStefano et al. | |
| 6,310,390 B1 | 10/2001 | Moden | |
| 6,314,639 B1 | 11/2001 | Corisis | |
| 6,316,285 B1 | 11/2001 | Jiang et al. | |
| 6,323,058 B1 | 11/2001 | Murakamz et al. | |
| 6,326,242 B1 | 12/2001 | Brooks et al. | |
| 6,326,244 B1 | 12/2001 | Brooks et al. | |
| 6,326,687 B1 | 12/2001 | Corisis | |
| 6,326,697 B1 | 12/2001 | Farnworth | |
| 6,326,698 B1 | 12/2001 | Akram | |
| 6,329,220 B1 | 12/2001 | Bolken et al. | |
| 6,331,221 B1 | 12/2001 | Cobbley | |
| 6,331,453 B1 | 12/2001 | Bolken et al. | |
| 6,332,766 B1 | 12/2001 | Thummel | |
| 6,337,122 B1 | 1/2002 | Grigg et al. | |
| 6,364,196 B1 | 4/2002 | Wood et al. | |
| 6,391,251 B1 | 5/2002 | Keicher et al. | |
| 6,432,752 B1 | 8/2002 | Farnworth | |
| 6,451,709 B1 | 9/2002 | Hembree | |
| 6,461,881 B1 | 10/2002 | Farnworth et al. | |
| 6,468,891 B2 | 10/2002 | Williams | |
| 6,482,576 B1 | 11/2002 | Farnworth et al. | |
| 6,489,007 B2 | 12/2002 | Grigg et al. | |
| 6,493,932 B1 * | 12/2002 | Haba | 228/180.22 |
| 6,514,798 B2 | 2/2003 | Farnworth | |
| 6,524,346 B1 | 2/2003 | Farnworth | |
| 6,544,821 B2 | 4/2003 | Akram | |
| 6,544,902 B1 | 4/2003 | Farnworth | |
| 6,549,821 B1 | 4/2003 | Farnworth et al. | |
| 6,551,917 B2 * | 4/2003 | Cobbley et al. | 257/738 |
| 6,562,278 B1 | 5/2003 | Farnworth et al. | |
| 6,585,927 B2 | 7/2003 | Grigg et al. | |
| 6,589,820 B1 | 7/2003 | Bolken | |
| 6,590,295 B1 * | 7/2003 | Liao et al. | 257/780 |
| 6,593,171 B2 | 7/2003 | Farnworth et al. | |
| 6,600,171 B1 * | 7/2003 | Farnworth et al. | 257/780 |
| 6,613,662 B2 * | 9/2003 | Wark et al. | 257/780 |
| 6,630,736 B1 * | 10/2003 | Ignaut | 257/738 |
| 6,635,333 B2 | 10/2003 | Grigg et al. | |
| 6,664,139 B2 | 12/2003 | Bolken | |
| 2001/0038144 A1 | 11/2001 | Grigg | |
| 2002/0066966 A1 | 6/2002 | Farnworth | |
| 2002/0098623 A1 | 7/2002 | Akram | |
| 2002/0171177 A1 | 11/2002 | Kritchman et al. | |
| 2002/0182782 A1 | 12/2002 | Farnworth | |
| 2003/0003180 A1 | 1/2003 | Farnworth et al. | |
| 2003/0003380 A1 | 1/2003 | Farnworth et al. | |
| 2003/0003405 A1 | 1/2003 | Farnworth et al. | |
| 2003/0043360 A1 | 3/2003 | Farnworth | |
| 2003/0068584 A1 | 4/2003 | Farnworth et al. | |
| 2003/0072926 A1 | 4/2003 | Grigg et al. | |
| 2003/0077418 A1 | 4/2003 | Grigg et al. | |
| 2003/0089999 A1 | 5/2003 | Akram | |
| 2003/0092220 A1 | 5/2003 | Akram | |
| 2003/0093173 A1 | 5/2003 | Farnworth et al. | |
| 2003/0102566 A1 | 6/2003 | Farnworth | |
| 2003/0129787 A1 | 7/2003 | Farnworth | |
| 2003/0151167 A1 | 8/2003 | Kritchman et al. | |
| 2003/0201531 A1 | 10/2003 | Farnworth et al. | |
| 2003/0203158 A1 | 10/2003 | Farnworth et al. | |
| 2003/0207213 A1 | 11/2003 | Farnworth | |
| 2004/0000744 A1 | 1/2004 | Grigg et al. | |

OTHER PUBLICATIONS

U.S. Appl. No. 10/370,755, filed Feb. 20, 2003, Farnworth.

U.S. Appl. No. 10/619,918, filed Jul. 15, 2003, Farnworth.

U.S. Appl. No. 10/672,098, filed Sep. 26, 2003, Farnworth.

U.S. Appl. No. 10/690,417, filed Oct. 20 2003, Farnworth et al.

Miller, Doyle, et al., "Maskless Mesoscale Materials Deposition," HDI, Sep. 2001, pp. 20–22, <http://www.hdi-online.com>.

Miller, Doyle, "New Laser–Directed Technology," HDI, Aug. 2001, p. 16, <http://www.hdi–online.com>.

Mitchell, Curt E., "Photoimagable Solder Mask: The Case for UV Blocking Laminate," GE Electromaterials Technical Paper, General Electric Company, Feb. 1993, 8 pages, <http://www.geplastics.com/electromaterials/getekconnect/pdf/photoimagable_solder_mask_112901.pdf>.

"How it Works," Objet Geometries Ltd., 2003, retrieved from the Internet on Jan. 6, 2004, 2 pages, <http://www.2objet.com/Tech/howitworks.html>.

"Objet FullCure700 Series," Objet Geometries Ltd., 2003, retrieved from the Internet on Jan. 6, 2004, 2 pages, <http://www.2objet.com/Products/fc700.html>.

* cited by examiner

MICROELECTRONIC COMPONENT ASSEMBLIES HAVING EXPOSED CONTACTS

TECHNICAL FIELD

The present invention relates to microelectronic component assemblies. In particular, aspects of the invention relate to packaged microelectronic component assemblies and methods of manufacturing packaged microelectronic component assemblies. Certain embodiments of the invention are well-adapted for use in flip chip or ball grid array (BGA) applications.

BACKGROUND

Semiconductor chips or dies typically are manufactured from a semiconductor material such as silicon, germanium, or gallium/arsenide. An integrated circuit or other active feature(s) is incorporated in the device adjacent one surface (often referred to as the "active surface") of the device. The active surface typically also includes input and output contacts to facilitate electrical connection with another microelectronic component.

Flip-chip technology, including ball grid array packaging technology, is widely used in the microelectronics industry. In flip-chip technologies, a microelectronic component (e.g., a semiconductor die) having a pattern of conductive pads on an active surface is joined to a second microelectronic component, typically a higher level substrate such as a printed circuit board. Electrical contacts on the second microelectronic component are arranged in a mirror image to the contacts on the semiconductor die. Conductive structures—typically solder bumps (as exemplified by the so-called C-4 technology), conductive epoxy bumps or pillars, conductor-filled epoxy, or an anisotropically "Z-axis" conductive elastomer—are used to join the contacts on the first microelectronic component with corresponding contacts on the second microelectronic component, establishing electrical communication between the two microelectronic components.

Microelectronic components such as semiconductor dies often are sensitive to mechanical damage, external contamination, and moisture. To ameliorate these environmental factors, many microelectronic component assemblies are packaged in a polymeric or ceramic material that helps protect the underlying component(s). If these components are to be attached to a second microelectronic component using flip-chip techniques, the contacts of the first microelectronic component assembly must be electrically accessible through the package.

Providing a reliable electrical connection through the package can be problematic. In one approach, a solder ball or other conductive element is provided on the contacts of a semiconductor die or other microelectronic component. The solder-bumped component is then encapsulated in plastic. If conventional transfer molding techniques are employed in forming the plastic package, the resin may substantially cover the solder balls or other connectors. To provide suitable electrical connections, this structure must be ground down using chemical-mechanical polishing (CMP) techniques, exposing a flat surface of the previously covered solder. To attach this microelectronic component to a second microelectronic component, another conductive structure, e.g., another solder ball or solder bump, must be applied to the exposed solder surfaces. This requires handling the microelectronic component assembly a number of times when transferring the assembly from one manufacturing stage to another. The CMP process can also be relatively messy, detrimentally affecting the microelectronic component assembly.

In other packaging techniques, the encapsulant is formed before the solder or other conductive structure is deposited. In one technique, the microelectronic component is completely encapsulated in the encapsulant material and openings subsequently are formed in the encapsulant to expose the contacts or other conductive structures of the microelectronic component. Again, though, this requires multiple handling steps and precise control of the process for forming the holes in the package without damaging the conductive structures intended to be accessed through the holes.

In other approaches, the mold element used in molding the encapsulant about the microelectronic component includes projections that abut the electrical contacts of the microelectronic component. When the encapsulant is injected into the mold, the encapsulant should flow around the projections, leaving an indentation through which the underlying contact is accessible. (One example of such a process is outlined in U.S. Pat. No. 6,028,356, the entirety of which is incorporated herein by reference.) In such processes, however, the encapsulant material tends to squeeze between some of the projections and the electrical contacts. This will leave a thin flash coating of the encapsulant on the electrical contacts. Accordingly, the packaged microelectronic component assembly typically must be further processed, e.g., in an etching operation, to remove this flash coating; failure to do so will jeopardize reliable electrical connections between the packaged component and other microelectronic components.

DETAILED DESCRIPTION

A. Overview

Figure 1:
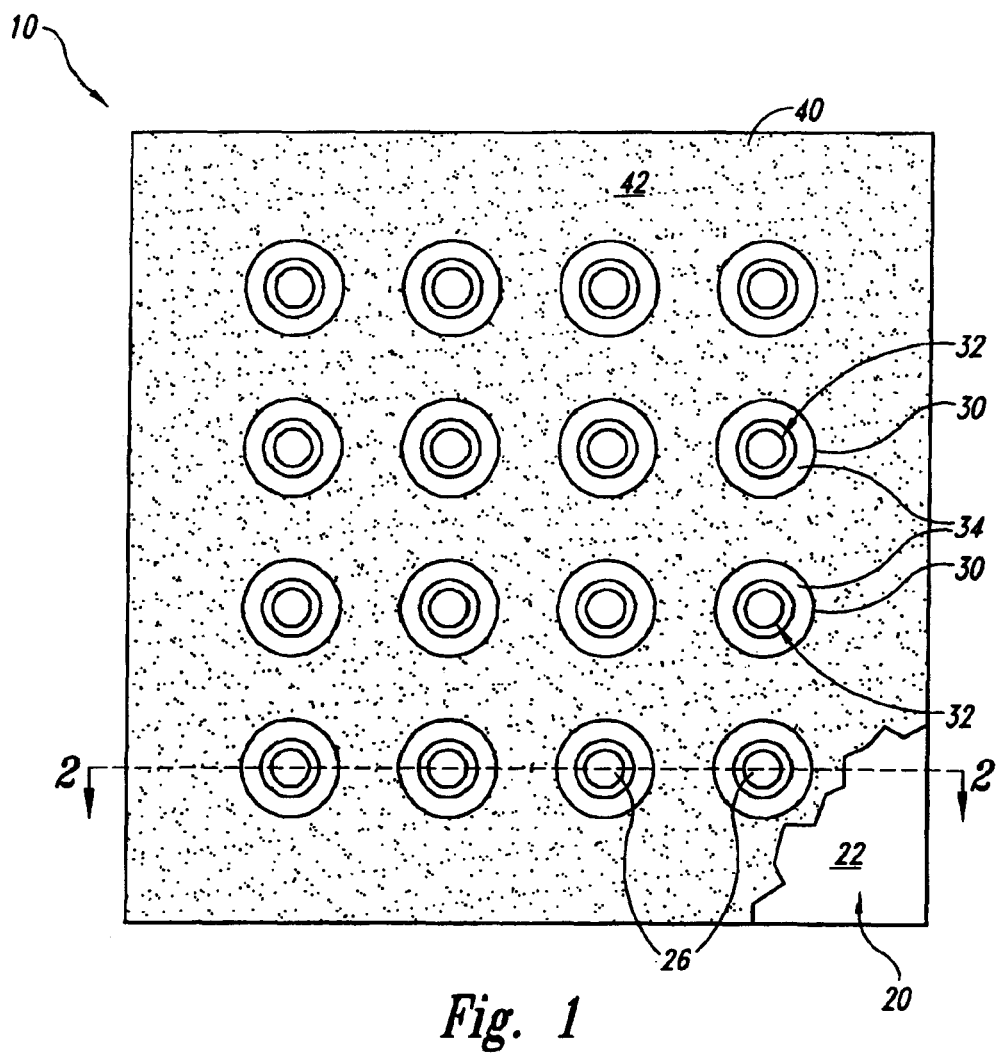
FIG. 1 is a schematic, partially broken-away top elevation view of a microelectronic component assembly in accordance with one embodiment of the invention.

Various embodiments of the present invention provide various microelectronic component assemblies and methods for forming microelectronic component assemblies. The terms "microelectronic component" and "microelectronic component assembly" may encompass a variety of articles of manufacture, including, e.g., SIMM, DRAM, flash-memory, ASICs, processors, flip chips, ball grid array (BGA) chips, or any of a variety of other types of microelectronic devices or components therefor.

In one embodiment, a microelectronic component assembly includes a microelectronic component, a first dam, a second dam, and an encapsulant. The microelectronic component has a surface that includes a covered region. The first dam is carried on the surface of the microelectronic component, with the first dam circumscribing a first uncovered region of the microelectronic component surface and having an external dam surface. The second dam is also carried on the surface of the microelectronic component. The second dam circumscribes a second uncovered region of the microelectronic component surface and has an external dam surface. The second uncovered region is spaced from the first uncovered region and a portion of the covered region extends between the first and second uncovered regions. The encapsulant is bonded to and substantially covers the covered region, with the encapsulant extending between the first and second dams and covering at least a portion of the external dam surface of each of the first and second dams.

A microelectronic component assembly in accordance with another embodiment includes a microelectronic component, an array of spaced-apart dams, and a dielectric material. The microelectronic component carries an array of contacts on an active surface. The dams are carried by the active surface of the microelectronic component with a portion of the active surface of the microelectronic component being external to the dams. Each of the dams is associated with and circumscribes an open contact volume associated with one of the contacts. The dielectric material covers the portion of the active surface that is external to the dams, with the dielectric material extending between the spaced-apart dams.

A method of manufacturing a microelectronic component assembly is provided by another embodiment. In accordance with this method, an array of spaced-apart dams is deposited on an active surface of a microelectronic component. Each dam circumscribes a contact volume associated with one contact of an array of contacts carried by the microelectronic component. An encapsulant is applied to the active surface of the microelectronic component by flowing the encapsulant between the dams. The encapsulant is applied at a thickness no greater than height of the dams, leaving the contacts exposed. Conductive structures (e.g., solder) are deposited in the contact areas on the contacts.

A microelectronic component assembly in accordance with a further embodiment includes a microelectronic component, an adhesive, and an uncured dielectric member. The microelectronic component has a contact surface and an array of contacts on the contact surface. The adhesive is in contact with the contact surface of the microelectronic component. The uncured dielectric member is formed of a curable, but uncured, dielectric. The dielectric member is attached to the contact surface of the microelectronic component by the adhesive and includes an array of pre-formed contact openings through the dielectric material. The array of contact openings is registered with the array of contacts such that an associated one of the contacts is accessible through each of the contact openings.

Another embodiment provides a microelectronic component assembly comprising a microelectronic component, a dielectric member, an adhesive, and an array of conductive structures. The microelectronic component carries an array of contacts. The dielectric member has a confronting surface, an outer surface, and an array of contact openings, each of which extends from the confronting surface to the outer surface. The array of contact openings is registered with the array of contacts such that an associated one of the contacts is accessible through each of the contact openings. Each contact opening has a restricted region and defines an associated anchor space between the restricted region and the microelectronic component. The restricted region of each contact opening has a restricted dimension less than a corresponding dimension of the associated anchor space. The adhesive joins the dielectric member to the microelectronic component. Each of the conductive structures is partially received in one of the contact openings and is in electrical contact with the contact associated with the contact opening. An anchor portion of each of the conductive structures is disposed in the anchor space associated with the contact opening in which it is received and has a dimension greater than the restricted dimension of that contact opening.

Yet another embodiment of the invention provides a method of manufacturing a microelectronic component assembly. In this method, a confronting surface of a preformed dielectric member is juxtaposed with a contact surface of a microelectronic component. The dielectric member is oriented with respect to the microelectronic component to register an array of contact openings extending through the dielectric member with an array of contacts on the contact surface of the microelectronic component.

The dielectric member is attached to the microelectronic component such that an associated one of the contacts is accessible through each of the contact openings. A plurality of conductive structures is deposited on the array of terminals, with each conductive structure being partially received in one of the contact openings.

For ease of understanding, the following discussion is subdivided into three areas of emphasis. The first section discusses microelectronic component assemblies employing dams and methods of manufacturing microelectronic component assemblies employing dams in accordance with selected embodiments of the invention; the second section describes aspects of microelectronic component assemblies employing preformed disks in other embodiments of the invention; and the third section discusses methods of manufacturing microelectronic component assemblies employing preformed disks in accordance with still other embodiments.

B. Microelectronic Component Assemblies Employing Dams

Figure 2:
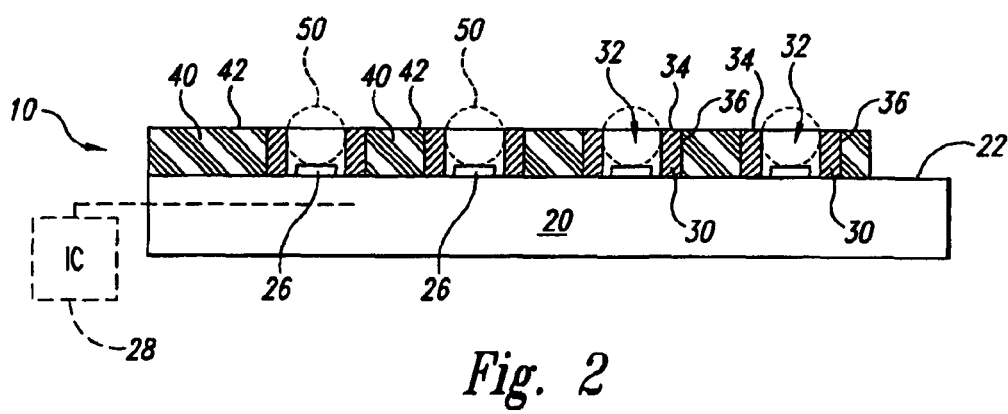
FIG. 2 is a schematic cross-sectional view of the microelectronic component assembly of FIG. 1 taken along line 2—2.

Certain embodiments of the invention provide microelectronic component assemblies that employ dams adapted to control the flow of an encapsulant during the manufacturing process. FIGS. 1 and 2 schematically illustrate one such microelectronic component assembly 10. This microelectronic component assembly 10 generally includes a microelectronic component 20, an array of dam members 30, and an encapsulant 40.

Figure 3:
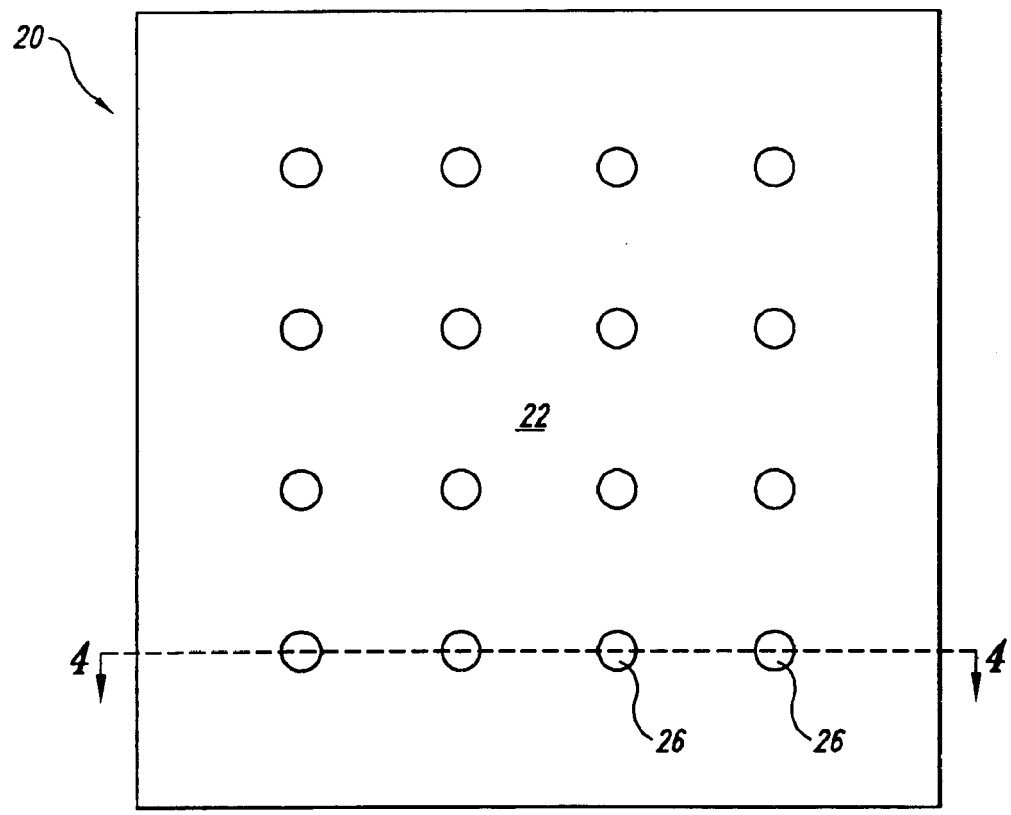
FIG. 3 is a schematic top elevation view of a microelectronic component used in the microelectronic component assembly of FIG. 1.
Figure 4:
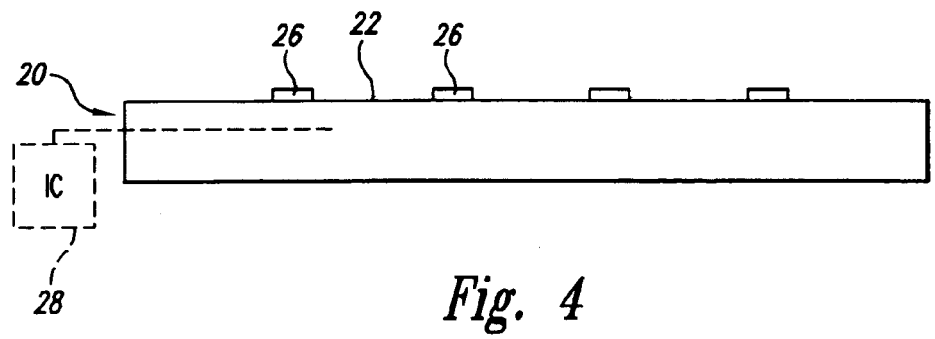
FIG. 4 is a schematic cross-sectional view of the microelectronic component of FIG. 3 taken along line 4—4.

The microelectronic component 20 (which is shown separately in FIGS. 3 and 4) may comprise a single microelectronic component or a subassembly of separate microelectronic components. In the illustrated embodiment, the microelectronic component 20 is typified as a single semiconductor die. In one particular implementation, the microelectronic component 20 comprises a memory element, e.g., SIMM, DRAM, or flash memory. In another embodiment, the microelectronic component 20 may comprise a semiconductor wafer including a plurality of unsingulated semiconductor dies. The microelectronic component 20 of FIGS. 1–4 includes a plurality of contacts 26 carried on an active surface 22 of the microelectronic component 20. The contacts 26 may be arranged on the active surface 22 in any suitable fashion. Typically, the contacts 26 will be arranged in an array, e.g., a generally rectangular array, as shown, a peripheral array, or a linear array. Some or all of these contacts 26 may be electrically coupled to an active feature of the microelectronic component 20, which is schematically depicted in FIG. 2 as an integrated circuit 28.

The microelectronic component assembly 10 includes an array of dams 30 that is carried on the active surface 22 of the microelectronic component 20. Each of the dams 30 is associated with one of the contacts 26 of the microelectronic component 20. In particular, each of the dams 30 circumscribes a portion of the active surface 22 of the microelectronic component 20 that includes one of the contacts 26. In the embodiment shown in FIGS. 1 and 2, each of the dams 30 comprises a generally cylindrical member having a cylindrical exterior surface 36 and a lumen that defines an interior volume 32 of the dam 30. Although the dams shown in FIGS. 1 and 2 are generally cylindrical in shape and have a circular cross section, it should be recognized that the dams 30 may instead have square cross sections, rectangular cross sections, or any other useful cross sections.

Each of the dams 30 has a predetermined minimum height. In one embodiment, each of the dams has approximately the same height, i.e., the upper ends 34 of each of the dams 30 is spaced about the same distance above the active surface 22 of the microelectronic component 20. (Although the ends 34 are referred to as "upper ends" that are spaced "above" the active surface 22, it should be recognized that this is solely for purposes of convenience in the context of the drawings, which show the microelectronic component assembly 10 in one particular orientation. If the microelectronic component assembly 10 is oriented differently, the "upper" ends 34 may be at the same height as or lower than the active surface 22.)

In the illustrated embodiment, the dams 30 are spaced from one another to define an array of discrete dams 30. As a consequence, some of the active surface 22 of the microelectronic component 20 is exterior to the dams, i.e., is not covered by or circumscribed within any of the dams 30.

In one embodiment, the dams 30 comprise a conductive material. In another embodiment, the dams 30 are formed of a dielectric material, such as a conventional solder mask material. If so desired, each of the dams 30 may be formed of the same material.

An encapsulant 40 may cover some or all of the active surface 22 of the microelectronic component 20 that is external to, i.e., is not covered by or circumscribed within, the dams 30. In one embodiment, the encapsulant 40 covers the entire active surface 22 of the microelectronic component 20 external to the dams 30. (The encapsulant 40 is broken away in the lower right corner of FIG. 1 to expose the active surface 22 of the microelectronic component 20 for purposes of illustration.)

The outer surface 42 of the encapsulant 40 is spaced outwardly from the active surface 22 of the microelectronic component 20. In one embodiment, the encapsulant 40 has a thickness approximately equal to the height of the dams 30 so that the outer surface 42 of the encapsulant 40 is generally coplanar with the upper ends 34 of the dams 30. In other embodiments, one of which is discussed below in connection with FIGS. 10 and 11, the outer surface 42 of the encapsulant 40 may be closer to the active surface 22 than are the upper ends 34 of the dams 30.

The encapsulant 40 may be formed of any of a variety of materials. It is anticipated that the encapsulant 40 in many applications will comprise an encapsulant of the type commonly employed in encapsulating microelectronic components, e.g., a dielectric epoxy, a dielectric resin, or other dielectric plastic material.

FIGS. 3–9 schematically illustrate stages in the manufacture of the microelectronic component 10 in accordance with one method of the invention. In accordance with this particular method, a microelectronic component 20, shown in FIGS. 3 and 4, may be cleaned or otherwise prepared for subsequent processing. An array of spaced-apart dams 30 may be deposited on the active surface 22 of the microelectronic component 20, yielding the partially assembled microelectronic component assembly 12 of FIGS. 5 and 6. The dams 30 of this microelectronic component assembly 12 are all generally cylindrical in shape and have about the same height so that the upper ends 34 of the dams 30 lie in a common plane P that is parallel to the active surface 22 of the microelectronic component 20. One of the contacts 26 of the microelectronic component 20 is exposed within the interior volume 32 of each of the dams 30. In the embodiment of FIGS. 1–9, the dams 30 have an inner diameter that is slightly larger than the diameter of the contacts 26 received therein. As a consequence, the portion of the active surface 22 circumscribed by each of the dams is slightly larger than the contact 26 encompassed thereby. In other embodiments (e.g., the embodiment discussed below in FIGS. 10 and 11), the dams 30 may have inner diameters the same size as or smaller than the diameter of the contacts 26.

Figure 5:
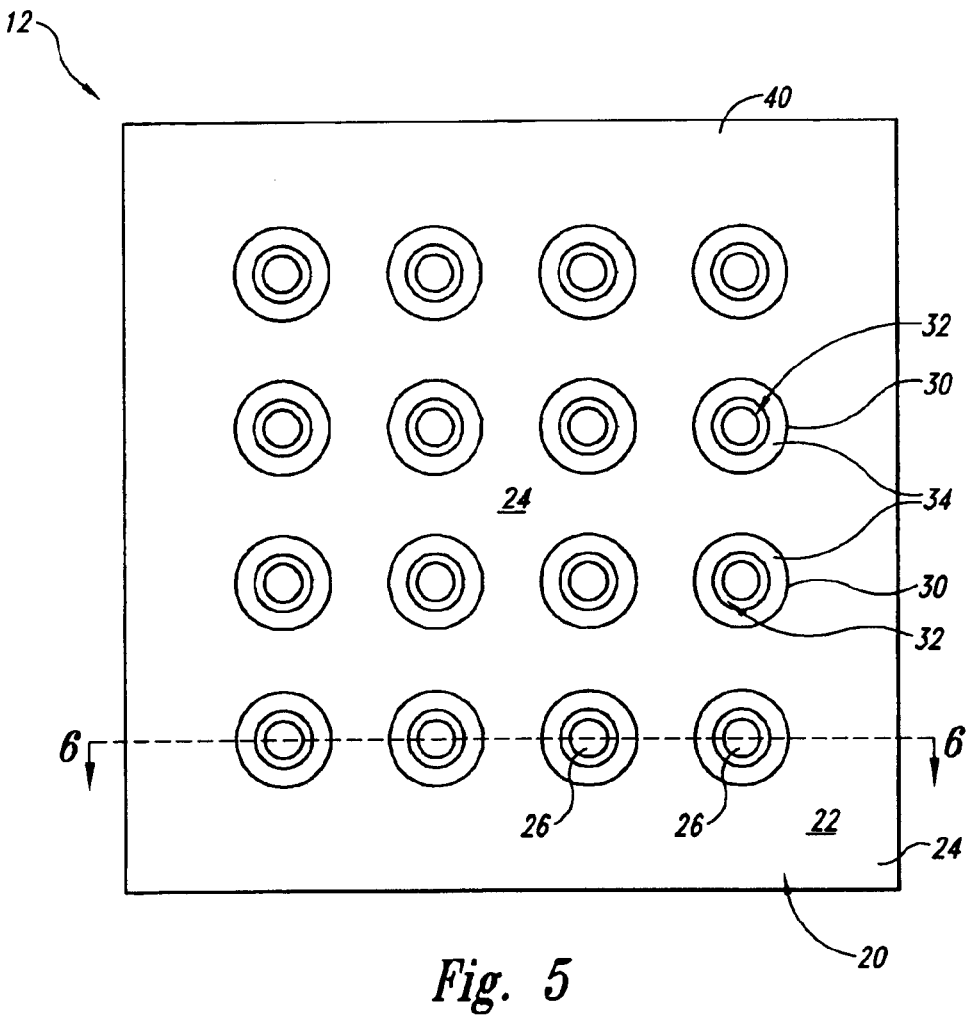
FIG. 5 is a schematic top elevation view illustrating a stage in the manufacture of the microelectronic component of FIG. 1.
Figure 6:
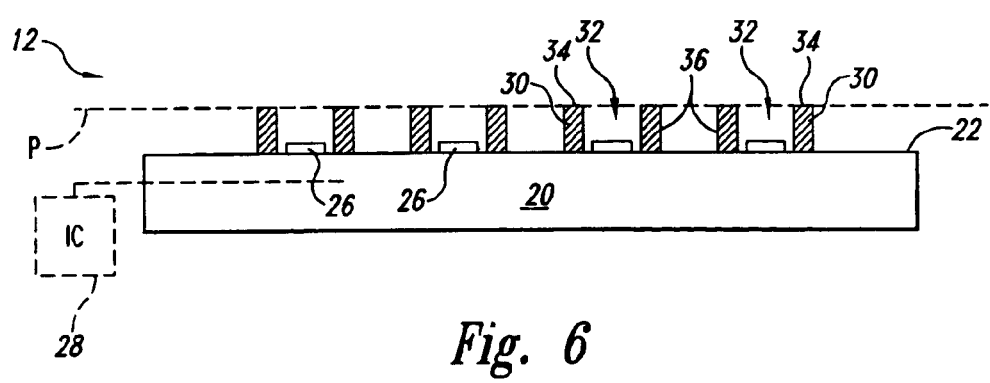
FIG. 6 is a schematic cross-sectional view of the device of FIG. 5 taken along line 6—6.

The dams 30 are spaced apart from one another, leaving an exposed portion 24 of the active surface 22 external to the dams 30. Although the dams 30 shown in FIGS. 5 and 6 are spaced at regular intervals to define a regular rectangular array, the space between adjacent dams may vary.

The dams 30 may be deposited upon the microelectronic component active surface 22 in any suitable fashion. In some embodiments, the dams 30 are deposited using techniques conventionally used to deposit solder masks on microelectronic components. In one such embodiment, the dams 30 are deposited by stencil printing, silkscreening, or other conventional solder mask printing techniques. In another embodiment, the dams 30 are formed by first depositing a monolithic layer of the desired material on the active surface 22, such as by spin coating a photoresist material on the active surface 22, then removing the unwanted portions of this monolithic layer, e.g., by conventional photomask and etch processes. In another embodiment, the dams 30 are formed using stereolithographic techniques; one apparatus and method that may be adapted for use in forming the dams 30 stereolithographically is disclosed in U.S. Pat. No. 6,461,881, the entirety of which is incorporated herein by reference.

The encapsulant 40 may be deposited on the exposed portion 24 of the active surface 22 in a variety of fashions. In one embodiment, a quantity of the encapsulant 40 is delivered to an area of the active surface 22 and is allowed to "wick" to cover the remainder of the exposed portion 24. In this embodiment, it may be advantageous for the encapsulant 40 to be formed from a relatively low viscosity curable resin that can flow relatively freely between the dams 30 to provide adequate coverage of the exposed portion 24 of the active surface 22. After delivery, the encapsulant 40 may be cured, e.g., by heating or ultraviolet (UV) irradiation. Heat- and UV-curable resins for use as microelectronic component encapsulants are commercially available from a wide variety of sources.

The encapsulant 40 may be applied at a thickness no greater than the height of the common plane P of the dam upper ends 34, leaving the contacts 26 exposed within the interior volume 32 of the dams 30. If the encapsulant 40 is applied to the active surface 22 by wicking, the height of the encapsulant 40 along the exterior surface 36 of the dams 30 may be controlled, in part, by controlling the volume and viscosity of the encapsulant resin.

Figure 7:
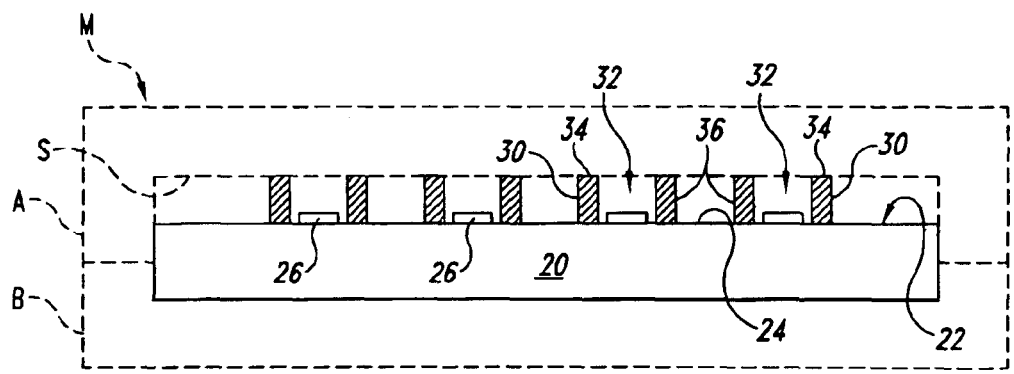
FIG. 7 is a schematic illustration in partial cross section depicting aspects of a further stage in the manufacture of the microelectronic component assembly of FIG. 1.

FIG. 7 schematically illustrates a mold M that may be used to apply the encapsulant 40 using conventional transfer molding techniques. The mold M includes a first mold element A and a second mold element B. The mold M includes a mold surface S. This mold surface S may be adapted to engage the generally coplanar upper ends 34 of the dams 30. The material of the encapsulant 40 may then be injected into the mold cavity defined by the mold and the microelectronic component 20, forcing the encapsulant to flow between the dams 30 to substantially cover the exposed portion 24 of the active surface 22. The engagement of the mold surface S with the upper ends 34 of the dams 30 will limit the flow of the encapsulant material into the interior volumes 32 of the dams.

Figure 8:
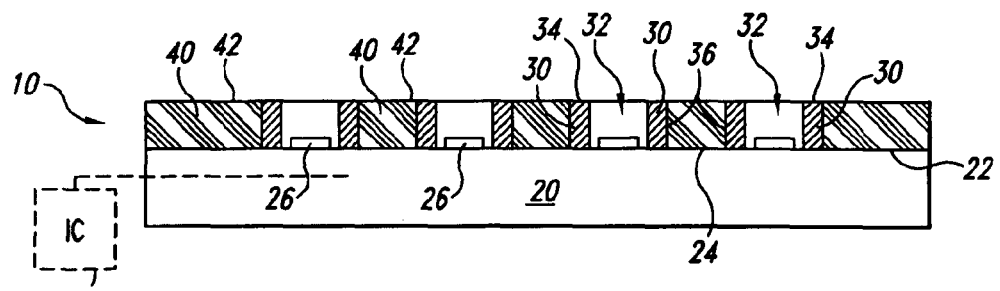
FIG. 8 is a schematic cross-sectional view of the microelectronic component assembly resulting from the manufacturing stage depicted in FIG. 7.
Figure 9:
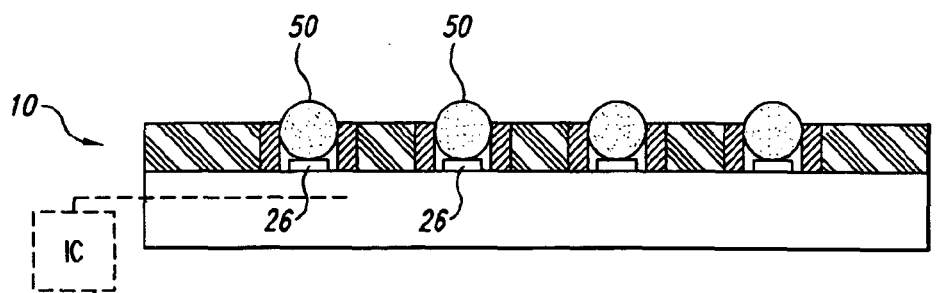
FIG. 9 is a schematic cross-sectional view of the microelectronic component assembly of FIG. 8 having conductive structures deposited on the contacts of the microelectronic component.

FIG. 8 schematically illustrates a microelectronic assembly 10 resulting from a transfer molding operation in the mold M of FIG. 7. In this embodiment, the outer surface 42 of the encapsulant 40 is generally coplanar with the upper ends 34 of the dams 30. As noted above, in some transfer molding operations, a small flash coating of the encapsulant may be deposited between the mold element and the underlying structures in contact with the mold element. In U.S. Pat. No. 6,028,356, discussed above, this thin coating of the encapsulant material must be removed to provide adequate electrical contact with the underlying leads. In the embodiment shown in FIG. 8, the overflow of the encapsulant material 40 may form a flash coating on the upper ends 34 of the dams 30, but this would still leave the contacts 26 exposed within the interior volume 32 of the dams 30.

Because the contacts 26 remain exposed, conductive structures 50 can be deposited directly on the contacts 26 of the microelectronic component 20 without requiring the additional step of cleaning excess encapsulant from the contacts 26. Although the conductive structures 50 are typified in FIG. 9 as solder balls, the conductive structures 50 may be any other known type of conductive structure, suitably configured as balls, bumps, or pillars, for example. The conductive structures can be formed from any type of conductive material or combination of materials known to be useful as a conductive structure of a microelectronic component assembly. Such materials include, without limitation, solders, other metals, metal alloys, conductive epoxies, conductor-filled epoxies, and "z-axis" elastomers. If so desired, the conductive structures 50 may extend outwardly beyond the outer surface 42 of the encapsulant 40.

In one embodiment, the conductive structures 50 are deposited on the contacts 26 after the encapsulant 40 is applied, as discussed above. In another embodiment, the conductive structures 50 may be deposited before the encapsulant 40 is applied. In one particular implementation of this embodiment, the encapsulant-free microelectronic component subassembly (not shown) may be used as a flip chip or a BGA chip. After this microelectronic component subassembly is attached to another microelectronic component (e.g., a printed circuit board or other substrate), an underfill material may be delivered to cover the exposed portion of 24 of the active surface 22. This underfill material may be allowed to flow between the dams 30 to substantially cover the exposed portions 24 of the active surface 22 and, therefore, serve as the encapsulant 40. In such a circumstance, the encapsulant 40 may extend outwardly beyond the "upper" ends 34 of the dams 30.

Figure 10:
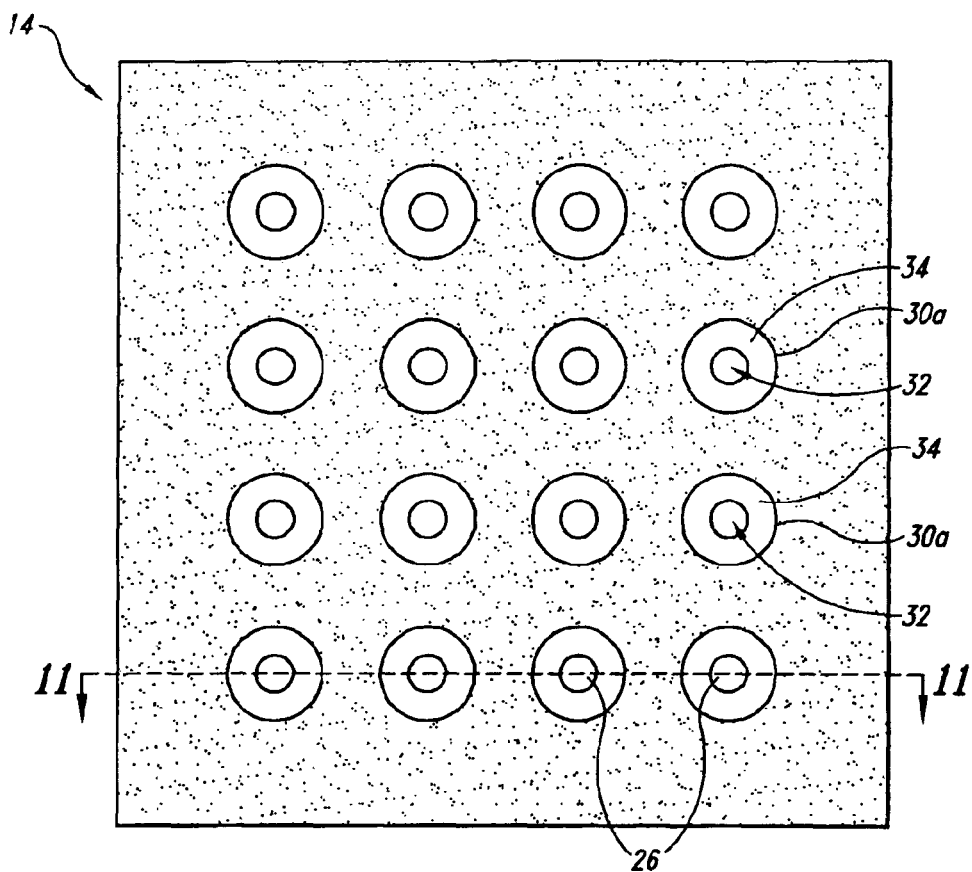
FIG. 10 is a schematic top elevation view of a microelectronic component assembly in accordance with another embodiment of the invention.
Figure 11:
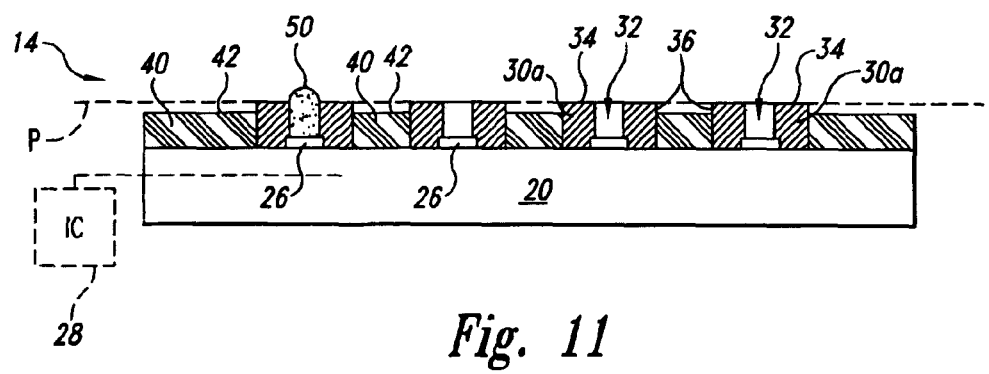
FIG. 11 is a schematic cross-sectional view of the microelectronic component assembly of FIG. 10 taken along the line of 11—11.

FIGS. 10 and 11 illustrate a microelectronic component assembly 14 in accordance with a modified embodiment of the invention. Many of the elements of the microelectronic assembly 14 may be the same as, or at least analogous to, the elements of the microelectronic component assembly 10 discussed above; like reference numbers are used in FIGS. 1–11 to indicate like elements.

One of the distinctions between the microelectronic component assemblies 10 and 14 is the relative position of the dams and the associated contacts 26. In FIGS. 1–9, each of the dams 30 has an inner diameter that is slightly greater than the diameter of the associated contact 26. In FIGS. 10 and 11, the dams 30a have inner diameters slightly smaller than the diameters of the contacts 26, and each of the dams slightly overlies the edges of the contacts 26. In the embodiment shown in FIG. 9, the contact structures 50 may tend toward a generally spherical structure upon reflow. In the embodiment of FIGS. 10 and 11, the conductive structures 50 (one of which is shown in FIG. 11 for purposes of illustration) may substantially fill the interior volume 32 of the dam 30 such that the dam 30 confines and defines a portion of the conductive structure 50.

In the embodiment discussed above in connection with FIGS. 1–9, the outer surface 42 of the encapsulant 40 is generally aligned with the substantially co-planar upper ends 34 of the dams 30. In FIG. 11, though, the outer surface 42 of the encapsulant 40 is spaced below the common plane P of the dam upper ends 34. The encapsulant 40, therefore, will cover a portion of the exterior surface 36 of each of the dams 30, leaving an outer portion of each of the exterior surfaces 36 exposed.

C. Microelectronic Component Assemblies Employing Preformed Disk Members

Figure 12:
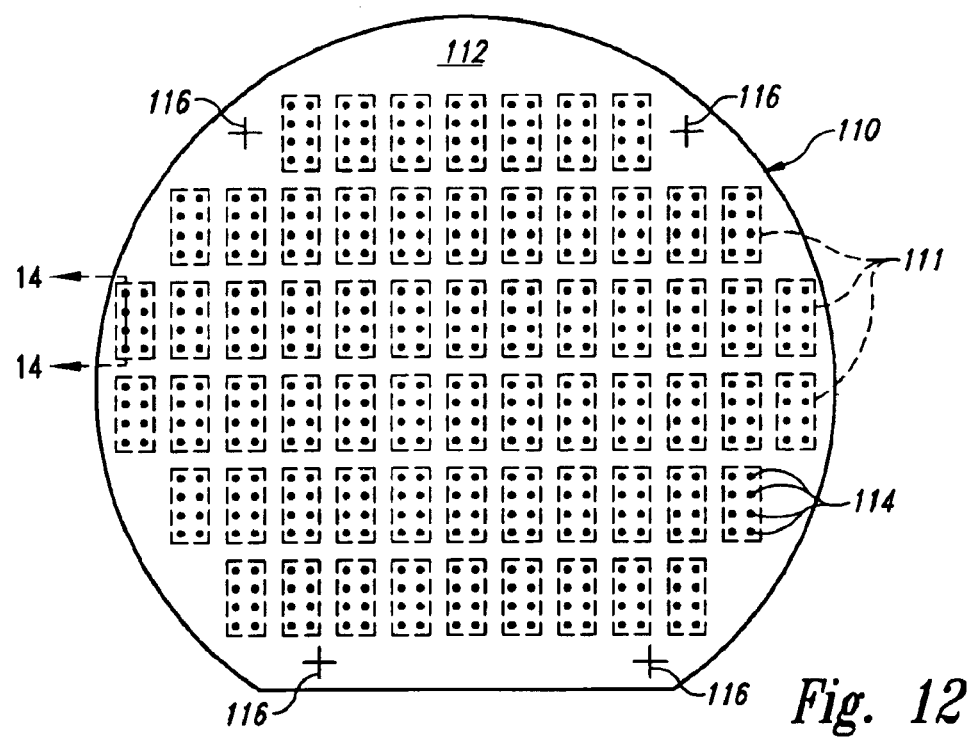
FIG. 12 is a schematic top view of a microelectronic component.
Figure 13:
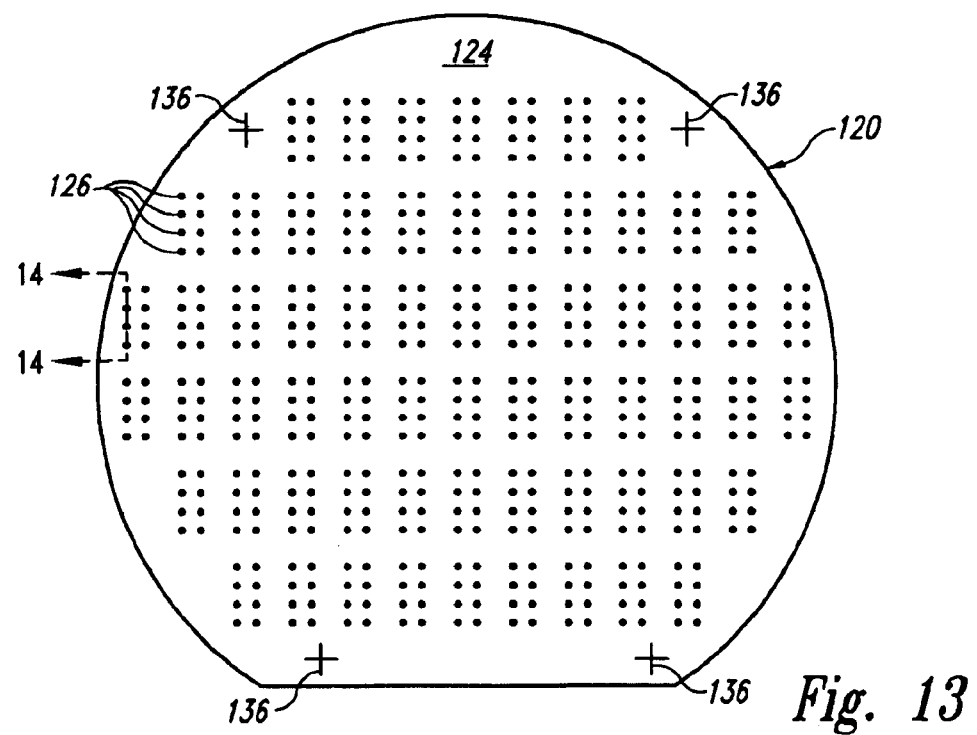
FIG. 13 is a schematic top elevation view of a preformed dielectric member adapted for use with the microelectronic component of FIG. 12.

FIGS. 12–19 illustrate aspects of other embodiments of the invention that employ a preformed dielectric member in a microelectronic component assembly. The microelectronic component assembly 100 shown in FIGS. 12–16 generally includes a microelectronic component 110 and dielectric number 120 attached thereto by an adhesive 140. As illustrated in FIG. 12, the microelectronic component 110 may take the form of a semiconductor wafer carrying a plurality of semiconductor dies 111. The microelectronic component 110 is not limited to a semiconductor wafer, though. In other embodiments, the microelectronic component 110 may comprise a singulated semiconductor die 111 or a microelectronic component subassembly including one or more semiconductor dies, for example. The microelectronic component 110 includes a plurality of contacts 114 carried on an active surface 112 of the microelectronic component 110. In the illustrated embodiment, the contacts 114 are arranged in an array with a fixed arrangement of contacts 114 associated with each of the semiconductor dies 111 of the microelectronic wafer 110. As suggested schematically in FIGS. 14 and 15, the microelectronic component 110 may include an integrated circuit 118 or any other suitable active feature.

In one embodiment, the microelectronic component 110 includes a plurality of fiducials 116 adapted to facilitate reproducible positioning of the microelectronic component using automated handling equipment with machine vision systems. In the illustrated embodiment, a plurality of fiducials 116 are arranged on the active surface 112 of the microelectronic component 110. As will be recognized by those skilled in the art, the size, shape, and arrangement of the fiducials 116 on the microelectronic component 110 can be optimized for the particular automated handling equipment being employed and the characteristics of the microelectronic component 110.

The dielectric member 120 of the microelectronic component 100 may have a size and shape adapted to interface with the microelectronic component 110. If the microelectronic component 110 comprises a semiconductor wafer, as depicted in FIG. 12, the dielectric member 120 may have a similar size and shape. The dielectric member 120 includes an outer surface 124, a confronting surface (122 in FIGS. 14 and 15), and a plurality of contact openings 126 that extend through the thickness of the dielectric member 120 between the confronting surface 122 and the outer surface 124. The contact openings 126 may be arranged on the dielectric member 120 so that each contact opening 126 may be associated with one of the contacts 114 on the microelectronic component 110 when the microelectronic component 110 and dielectric member 120 are properly aligned with respect to one another. To facilitate proper alignment, the dielectric member 120 may carry a plurality of fiducials 136, e.g., markings on the outer surface 124 of the dielectric member 120. As is known in the art, these fiducials 136 and the fiducials 116 on the microelectronic component 110 may be employed in machine vision systems to align the dielectric member 120 with the microelectronic component 110 in manufacturing operations.

The dielectric member 120 may be formed of any suitable material, including dielectric or non-dielectric materials. In some embodiments, though, the dielectric member 120 is formed of a dielectric material. Examples of such materials include plastics, photoimageable resins, glass (e.g., borophosphosilicate glass, phosphosilicate glass, or borosilicate glass), silicon dioxide, or silicon nitride. In one embodiment, the dielectric member 120 comprises a curable, but still uncured, plastic such as an epoxy or a resin of the type commonly employed as microelectronic component encapsulants, such as that noted above in connection with the embodiments of FIGS. 1–11.

The manner in which the contact openings 126 are formed will depend, at least in part, on the nature of the dielectric member 120. If the dielectric member 120 comprises a photoimageable resin, for example, the contact openings 126 may be formed using conventional photomask and etch processes. In another embodiment, the dielectric member 120 may be formed in a molding operation and the contact openings 126 may be formed during the molding operation. As another example, the dielectric member 120 may be formed as a flat disc or the like and the contact openings 126 may be machined through the dielectric member 120, e.g., using laser ablation, milling, drilling, or other known material removal methods.

Figure 14:
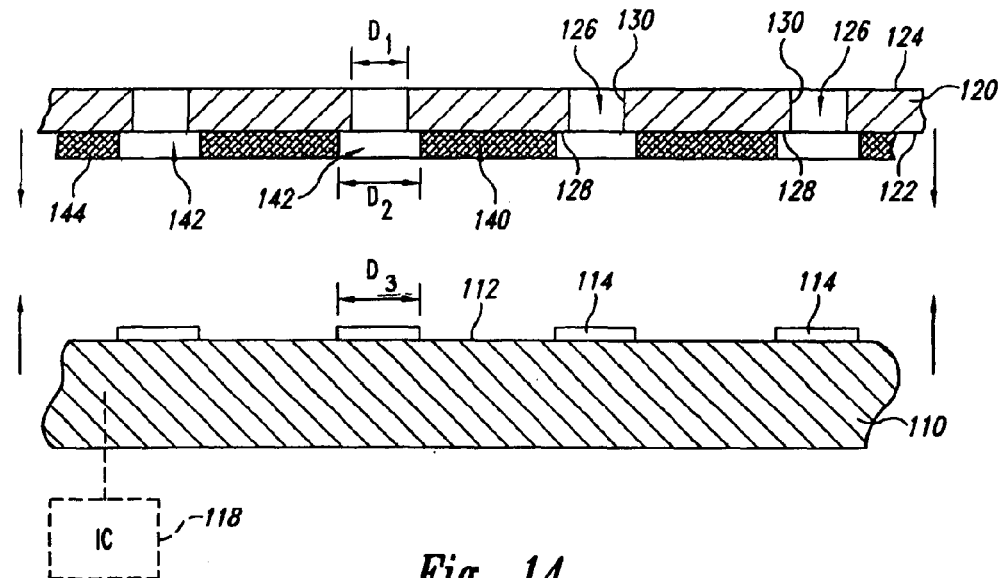
FIG. 14 is a schematic, partial cross-sectional view taken along lines 14—14 in FIGS. 12 and 13 that illustrates a stage in the manufacture of a microelectronic component assembly in accordance with another embodiment of the invention.
Figure 15:
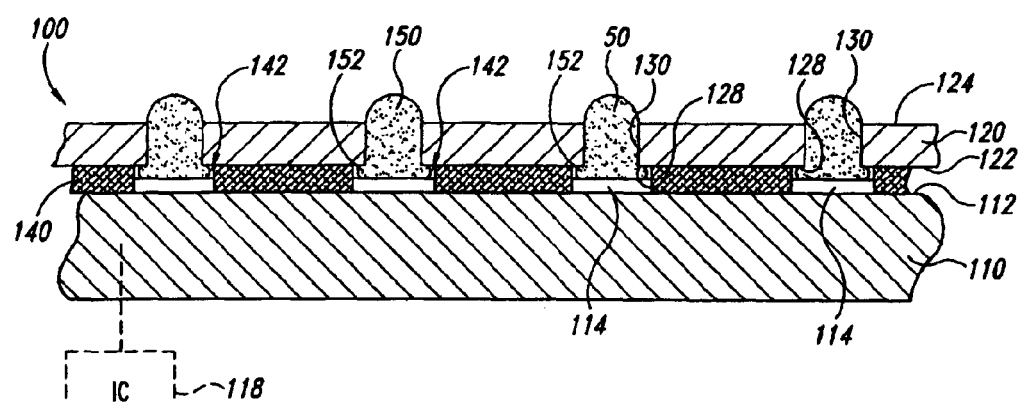
FIG. 15 is a schematic cross-sectional view of a microelectronic component assembly manufactured in accordance with the process partially illustrated in FIG. 14.

FIG. 14 schematically illustrates a stage in the manufacture of the microelectronic component assembly 110 shown in FIG. 15, for example. In this embodiment, the confronting surface 122 of the dielectric member 120 is juxtaposed with, but spaced from, the active surface 112 of the microelectronic component 110. In addition, each of the contact openings 126 of the dielectric member 120 is generally aligned with and associated one of the microelectronic component contacts 114.

The dielectric member 120 maybe attached to the microelectronic component 110 in a number of different ways. In the embodiment shown in FIGS. 14 and 15, for example, an adhesive 140 is disposed between the active surface 112 of the microelectronic component and the confronting surface 122 of the dielectric member 120. In one embodiment, the adhesive 140 comprises a separate member, e.g., a polyimide tape having an adhesive coating on both sides, disposed between the dielectric member 120 and the microelectronic component 110. In another embodiment the adhesive 140 comprises a coating of an adhesive material carried by the active surface 112 of the microelectronic component 110 and/or the confronting surface 122 of the dielectric member 120. In the particular embodiment shown in FIG. 14, the adhesive 140 comprises a thickness of a compliant, adhesive material applied to the dielectric member confronting surface 122. The adhesive 140 desirably includes a plurality of openings 142, each of which is associated with one of the contact openings 126 in the dielectric member 120. The manner in which the adhesive openings 142 are formed will depend, in part, on the nature of the adhesive 140. If the adhesive 140 comprises a layer of an adhesive material applied to the dielectric number confronting surface 122, as shown in FIG. 14, the adhesive may be applied using stencil printing or the like. Alternatively, the openings may be formed using photomask and etch processes or machined through the adhesive 140.

Figure 16:
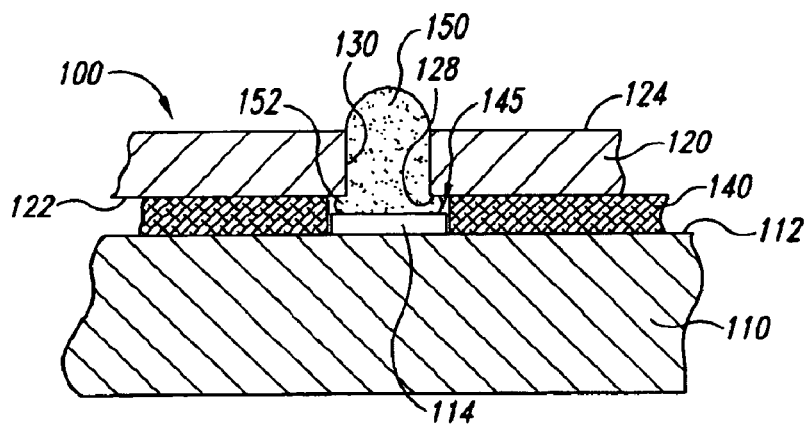
FIG. 16 is an enlarged isolation view of a portion of the microelectronic component assembly of FIG. 15.

In the particular embodiment shown in FIGS. 14–16, the contact openings 126 in the dielectric member 120 have a first dimension $D_1$ and the adhesive openings 140 have a larger dimension $D_2$. This defines a shoulder 128 of the confronting surface 122 extending about each of the contact openings 126.

In one implementation, each of the contact openings 126 is smaller than the contact 114 with which it is associated. In the illustrated embodiment, wherein the openings 126 and the contacts 114 are generally round, the opening diameter $D_1$ may be smaller than the contact diameter $D_3$. In one embodiment, the contact diameter $D_3$ is no larger than the diameter $D_2$ of the adhesive openings 142. In certain implementations, the contacts 114 have diameters $D_3$ that are the same as or slightly smaller than the adhesive opening diameter $D_2$ so each of the adhesive openings 142 may receive one of the contacts 114 therein. It should be recognized that the relative sizes of the dimensions $D_1$, $D_2$, and $D_3$ (namely D1<D3<D2) can be varied. For example, in another embodiment, the dimension $D_1$ of the contact openings 126 may be greater than a corresponding dimension $D_3$ of the associated contacts 114.

FIGS. 15 and 16 schematically illustrate a microelectronic component assembly 100 that may result when the microelectronic component 110 and the dielectric member 120 are moved toward one another as suggested by the arrows in FIG. 14. In moving from FIG. 14 to FIG. 15, the component surface (144 in FIG. 14) of the adhesive 140 is brought into contact with the active surface 112 of the microelectronic component 110. Each of the adhesive openings 142 receives one of the contacts 114, but the adhesive 140 in this specific embodiment has a thickness greater than the height of the contact 114. The resultant gap between the shoulder 128 of each of the contact openings 126 and the associated contact 114 defines an anchor space 145 between the opening 126 and the microelectronic component 110. This anchor space 145 has a dimension ($D_2$ in FIG. 14) greater than the corresponding dimension ($D_1$) of the contact opening 126.

A conductive structure 150 may be deposited on each of the contacts 114, with a portion of each conductive structure 150 at least partially received in the associated contact opening 126. The conductive structures 150 are typified in FIGS. 15 and 16 as solder bumps, but it should be recognized that the conductive structures 150 may be any other known type of conductive structure suitably configured as balls, bumps, pillars, etc. The conductive structures may be formed from any type of conductive material or combination of materials known to be useful as a conductive structure of a microelectronic component assembly. Such materials include, without limitation, solders, other metals, metal alloys, conductive epoxies, conductor-filled epoxies, and "Z-axis" elastomers.

In one useful embodiment, the conductive structures 150 comprise a reflowable solder or the like. Such reflowable solders are well known in the art. Typically, the solder will be deposited on the contacts 114 and heated to a reflow temperature to bond the solder to the contacts 114. As noted above, an anchor space 145 may be defined between the microelectronic component 110 and the facing shoulder 128 of the associated contact opening 126. In the particular embodiment shown in FIGS. 15 and 16, the conductive structures 150 have been heated to their reflow temperature and have reflowed such that an anchor portion 152 of each conductive structure 150 has expanded outwardly into the anchor space 145 beyond the diameter $D_1$ of the contact opening 126 (FIG. 14). This will mechanically engage the conductive structures 150 with the rest of the microelectronic component assembly 100, providing a mechanical attachment in addition to the conventional metallurgical bond between the conductive structure 150 and the contact 114.

As noted above, the anchor space 145 has a dimension greater than the corresponding dimension of the contact opening 126. Hence, the inner wall 130 of each contact opening 126 functions as a restricted region that confines movement of the conductive structure 150. In addition to providing a mechanical attachment of the conductive structure 150 to the rest of the microelectronic component assembly 100, this restricted region promotes good electrical contact between the conductive structures 150 and the associated contacts 114 during use. As is known in the art, providing electrical power to the microelectronic component 110 in use tends to heat conductive structures 150. For some embodiments, the coefficient of thermal expansion of the conductive structure 150 may be greater than the coefficient of thermal expansion for other elements of the microelectronic component assembly 100. In the embodiment of FIGS. 14–16, an anchor portion 152 of the conductive structure 150 is received in an anchor space 145 between the microelectronic component 110 and the restricted region defined by the contact opening 126. As the conductive structure 150 expands when heated during use, it will tend to expand within the anchor space 145, as well. This will cause the conductive structure 150 to urge outwardly against the confronting surface 122 of the dielectric member 120. The dielectric member 120 exerts an opposing force on the conductive structure 150, helping urge the conductive structure 150 into firm engagement with the contact 114.

Figure 17:
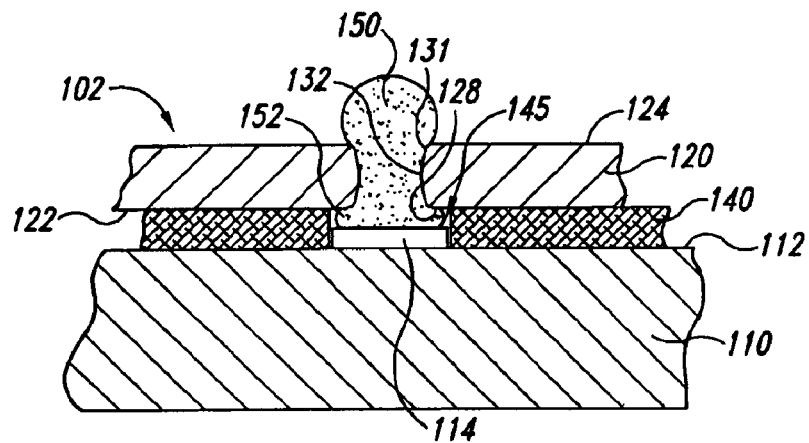
FIG. 17 is a schematic cross-sectional view of a portion of a microelectronic component assembly in accordance with an alternative embodiment of the invention.
Figure 18:
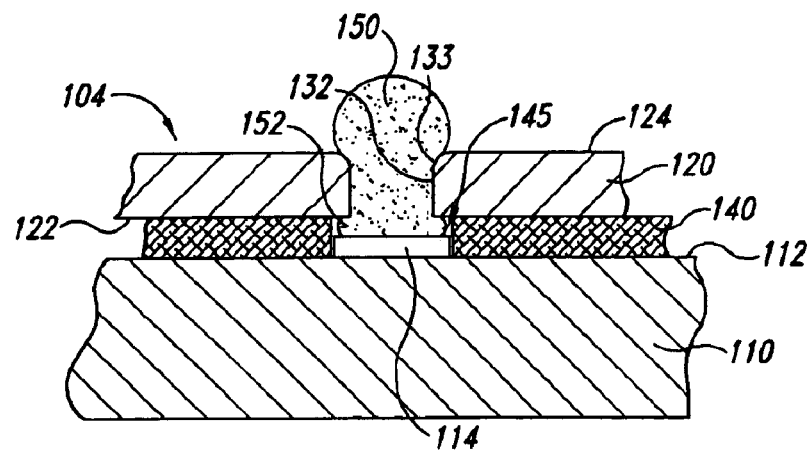
FIG. 18 is a schematic cross-sectional view of a portion of a microelectronic component assembly in accordance with a further embodiment of the invention.

FIGS. 17 and 18 illustrate portions of microelectronic component assemblies 102 and 104, respectively, in accordance with other embodiments of the invention. The primary difference between the microelectronic component assemblies 100, 102, and 104 lies in the shape of the openings in the dielectric member 120. In the embodiment of FIGS. 14–16, each contact opening 126 has a relatively straight inner wall 130 that is generally perpendicular to the confronting surface .122 and to the outer surface 124. In FIG. 17, the contact openings in the dielectric member 120 have curved inner walls 131 that have a maximum diameter adjacent each of the surfaces 122 and 124 of the dielectric member and a restricted region 132 between the two surfaces 122 and 124. This presents the contact openings 126 with a curved longitudinal profile. Such a curved longitudinal profile can reduce corner stresses that may develop in the conductive structure 150 where a sharp corner of the dielectric member 120 engages the conductive structure 150. In addition, the reduced diameter portion 132 of the contact openings in FIG. 17 can further enhance the mechanical engagement between the conductive structures 150 and the dielectric member 120.

The microelectronic component assembly 104 of FIG. 18 also has a somewhat curved inner wall 133. In this embodiment, the restricted region 132 of the contact opening extends longitudinally from the confronting surface 122 toward the outer surface. The wall 133 flares outwardly toward the outer surface 124, providing a rounded junction between the conductive structure 150 and the dielectric member 120, in turn reducing stress concentration in the conductive structure 150. The reduced diameter portion 132 may have a substantially constant diameter, as shown.

Figure 19:
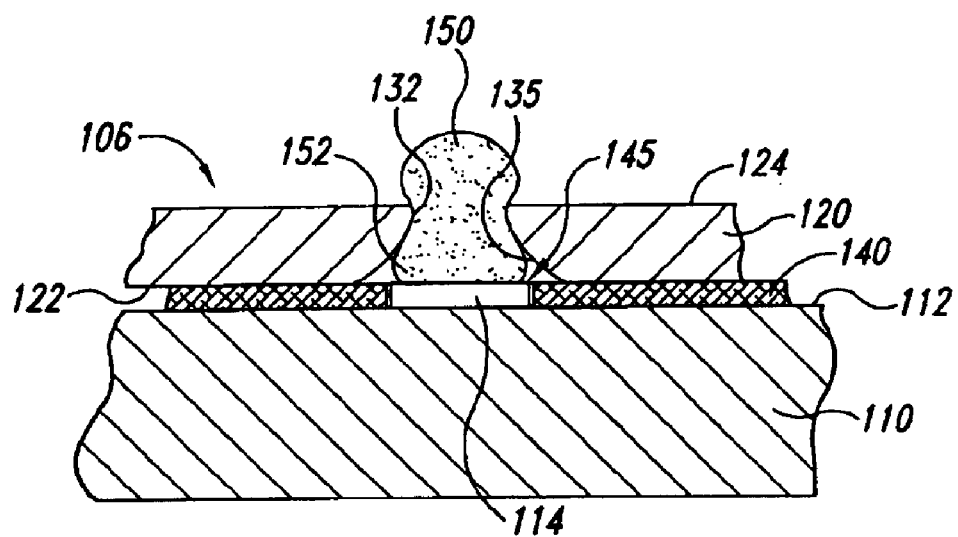
FIG. 19 is a schematic cross-sectional view of a portion of a microelectronic component assembly in accordance with yet another embodiment of the invention.

FIG. 19 schematically illustrates a portion of a microelectronic component assembly 106 in accordance with another embodiment. In this embodiment, the dielectric member 120 is attached to the microelectronic component 110 by an adhesive layer 140. In the previous embodiments, the adhesive layer 140 was thicker than the height of the contact 114. In FIG. 19, the adhesive layer 140 has a thickness about the same as the height of the contact 114. In other embodiments, the adhesive 140 may have a thickness that is less than the height of the contact 114. The contact openings (126 in FIG. 14) of the dielectric member 120 in this embodiment have from the contact openings a curved longitudinal profile with a minimum dimension in a restricted region 152 disposed adjacent the outer surface 124 of the dielectric member 120. The contact opening 126 tapers outwardly in a longitudinal direction from the restricted region 132 toward the microelectronic component 110. This defines an expanded region of the contact opening 126 disposed between the restricted region 132 and the microelectronic component 110. The tapering profile of this expanded region defines a curved, tapered shoulder 135 that faces toward the microelectronic component 110. This expanded region at least in part defines the anchor space 145 within which the anchor portion 152 of the conductive structure 150 is received. In the particular embodiment shown in FIG. 19, the minimum dimension of the restricted region 132 is slightly smaller than a corresponding dimension of the contact 114. In another embodiment, the minimum dimension of the restricted region 132 is greater than a corresponding dimension of the contact 114. Even in such an embodiment, the tapered shoulder 135 of the contact opening 126 will engage the enlarged anchor portion 152 of the conductive structure 150, providing a suitable mechanical joint.

Figure 20:
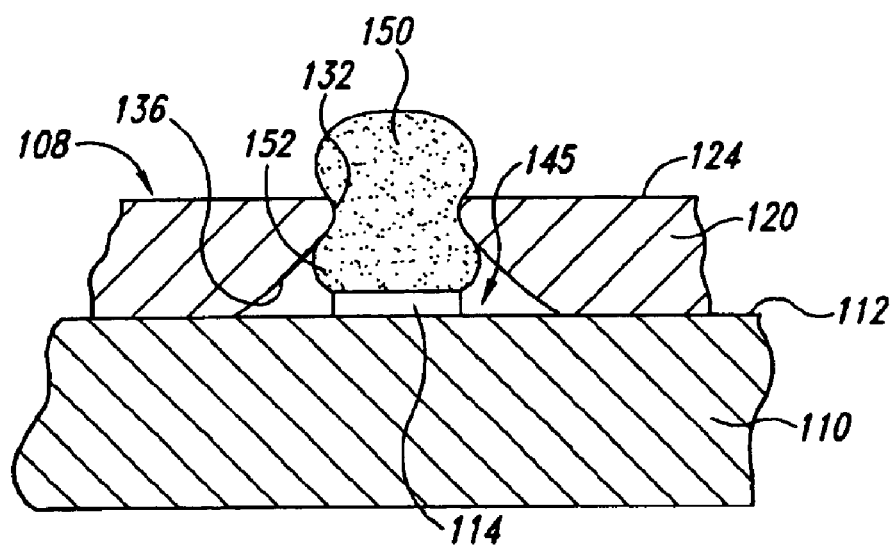
FIG. 20 is a schematic cross-sectional view of a portion of a microelectronic component assembly in accordance with still another embodiment of the invention.

FIG. 20 schematically illustrates a portion of a microelectronic component assembly 108 in accordance with still another embodiment. In the embodiments shown in FIGS. 14–19, the dielectric member 120 is attached to the active surface 112 of the microelectronic component 110 by an adhesive member 140. In the embodiment shown in FIG. 20, though, the adhesive member 140 is omitted. Instead, the dielectric member 120 may be formed of a material that can bond directly with the active surface 112 or any coating (e.g., a passivation or protective coating) carried on the active surface 112. In one exemplary embodiment, the dielectric member 120 of the microelectronic component assembly 108 is formed of a curable dielectric material. This dielectric member 120 may be positioned on the active surface 112 of the microelectronic component 110 while still in its uncured state. By subsequent curing (e.g., heat and/or UV curing), the dielectric member 120 may be cured to its final state while forming a bond directly with the active surface 112 (or any coating carried thereby). The shape of the contact opening 126 in the dielectric member 120 of FIG. 20 is similar to the contact opening in the dielectric member 120 in FIG. 19. In particular, the contact opening tapers outwardly in a longitudinal direction toward the microelectronic component from a restricted region 132 adjacent the outer surface 124 of the dielectric member 120. This defines an expanded region of the contact opening 126 and a tapered shoulder 136 that helps define the anchor space 145. The anchor portion 152 of the conductive structure 150 fills part of the anchor space 145 and has a maximum dimension that is greater than the minimum dimension of the restricted region 132 of the contact opening 126.

D. Methods of Manufacturing Microelectronic Component Assemblies Employing Preformed Disk Members As noted above, other embodiments of the invention provide methods of manufacturing microelectronic component assemblies. In the following discussion, reference is made to the particular microelectronic component assembly 100 shown in FIGS. 12–16. It should be understood, though, that reference to this particular microelectronic component assembly 100 is solely for purposes of illustration and that the method outlined below is not limited to any particular microelectronic component assembly design shown in the drawings or discussed in detail above.

Figure 21:
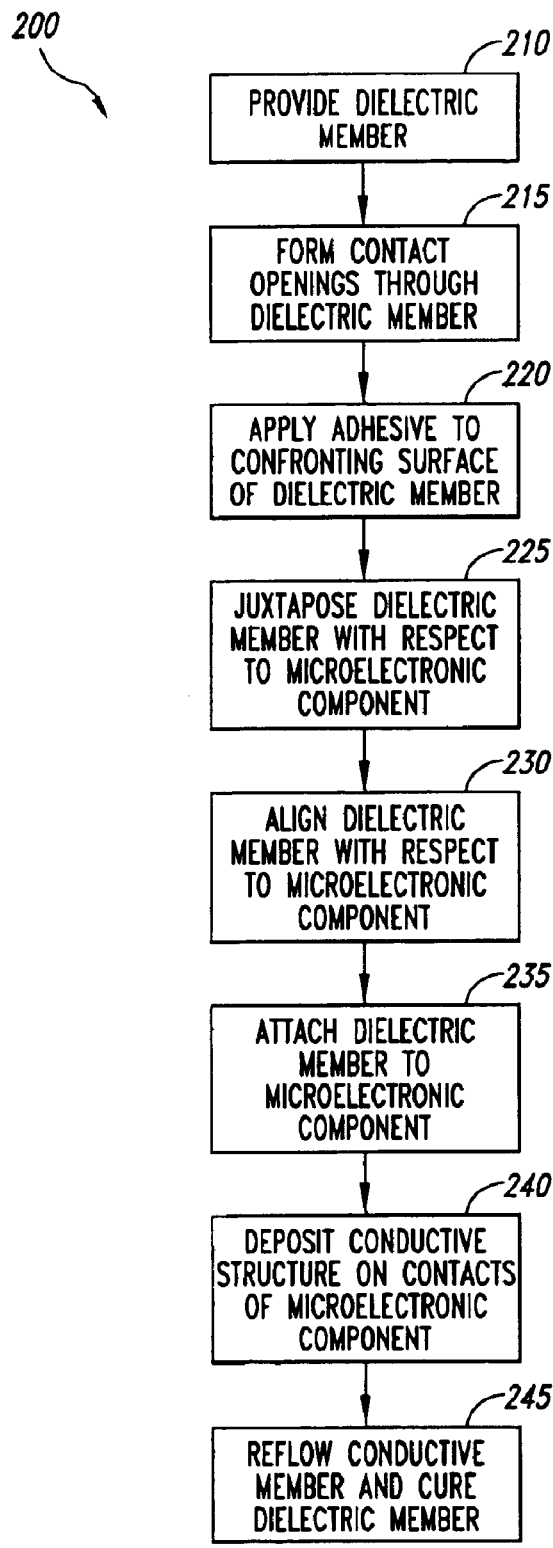
FIG. 21 is a flow diagram schematically illustrating aspects of a method of manufacturing a microelectronic component assembly in accordance with still another embodiment of the invention.

FIG. 21 schematically illustrates a manufacturing process 200 in accordance with one embodiment. This manufacturing process 200 starts at step 210 by providing a dielectric member 120. In one embodiment, the contact openings 126 are formed integrally with the dielectric member, e.g., by molding, as noted above. If the dielectric member 120 is manufactured without the contact openings 126, the contact openings 126 may be formed through the dielectric member 120 in step 215. As noted above, the manner in which the contact openings 126 are formed in the dielectric member 120 will depend, in part, on the nature of the dielectric member 120. Examples of suitable techniques for forming the contact openings 126 include machining the openings (e.g., via laser machining), and conventional photomask/etch operations. In the embodiment shown in FIG. 14, the adhesive 140 is carried by the dielectric member 120; using processes noted above, the adhesive 140 may be applied to the confronting surface 122 of the dielectric member 120 in step 220 of FIG. 19. In other embodiments, the adhesive 140 may instead be applied to the active surface 112 of the microelectronic component 110.

In step 225, the dielectric member 120 is juxtaposed with respect to the microelectronic component 110. This may comprise generally positioning the dielectric member 120 above the active surface 112 of the microelectronic component 110, for example. The dielectric member 120 may then be aligned with respect to the microelectronic component 110 so the array of contact openings 126 is registered with the array of contacts 114. Orienting the dielectric member 120 with respect to the microelectronic component 110 in this fashion will generally align each of the contact openings 126 with respect to an associated one of the contacts 114 of the microelectronic component 110. Though FIG. 21 identifies two separate steps 225 and 230, the dielectric member 120 may be juxtaposed and aligned with respect to the microelectronic component 110 in a single operation, e.g., using automated machine vision systems.

The dielectric member 120 may be attached to the microelectronic component 110 via the adhesive 140 in step 235. The material of the conductive members 150 may be deposited on the contacts 114 of the microelectronic component 110 in step 240. This can be accomplished in a variety of fashions, including physically aligning solder balls with respect to each of the contacts 114 or employing electrochemical deposition processes. In the particular embodiment outlined in FIG. 21, the conductive members 150 may be reflowed after they are deposited.

As noted above, in certain embodiments the dielectric member 120 initially comprises a curable, but uncured, dielectric material such as a curable epoxy. In such embodiments, the dielectric material may be UV-curable and the solder reflow and dielectric cure can take place at two separate steps. Alternatively, the dielectric material of the dielectric member 120 may comprise a heat-curable epoxy or resin and the material of the conductive members 150 may have a reflow temperature which is at least as great as a cure temperature of the uncured dielectric member 120. In such an embodiment, the solder may be reflowed and the dielectric member 120 may be cured in a single heating operation (step 245). In a further aspect of this embodiment, the adhesive 140 may comprise a heat-curable adhesive that has a cure temperature no greater than the reflow temperature of the conductive members 150, allowing the adhesive and the dielectric member 120 to be simultaneously cured during the reflow operation.

Unless the context clearly requires otherwise, throughout the description and the claims, the words "comprise," "comprising," and the like are to be construed in an inclusive sense as opposed to an exclusive or exhaustive sense, that is to say, in a sense of "including, but not limited to." Words using the singular or plural number also include the plural or singular number, respectively. When the claims use the word "or" in reference to a list of two or more items, that word covers all of the following interpretations of the word: any of the items in the list, all of the items in the list, and any combination of the items in the list.

The above-detailed descriptions of embodiments of the invention are not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, whereas steps are presented in a given order, alternative embodiments may perform steps in a different order. The various embodiments described herein can be combined to provide further embodiments.

In general, the terms used in the following claims should not be construed to limit the invention to the specific embodiments disclosed in the specification, unless the above-detailed description explicitly defines such terms. While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention.

We claim:

1. A microelectronic component assembly comprising:
   a microelectronic component having a surface that includes a covered region;
   a first dam carried on the surface of the microelectronic component, the first dam circumscribing a first uncovered region of the microelectronic component surface and having external dam surface;
   a second dam carried on the surface of the microelectronic component, the second dam circumscribing a second uncovered region of the microelectronic component surface and having an external dam surface, the second uncovered region being spaced from the first uncovered region and a portion of the covered region extending between the first and second uncovered regions; and
   an encapsulant bonded to and substantially covering the covered region, the encapsulant extending between the first and second dams and covering at least a portion of the external dam surface of the first dam and covering at least a portion of the external dam surface of the second dam.

2. The microelectronic component assembly of claim 1 wherein each of the dams is formed of the same material.

3. The microelectronic component assembly of claim 1 wherein each of the dams is formed of a material that is different from a material of the encapsulant.

4. The microelectronic component assembly of claim 1 wherein each of the dams is formed from a solder mask material.

5. The microelectronic component assembly of claim 1 wherein each of the dams is formed of a dielectric material.

6. The microelectronic component assembly of claim 1 wherein the first exposed region includes a contact of the microelectronic component coupled to an active feature of the microelectronic component.

7. The microelectronic component assembly of claim 1 wherein the first exposed region includes a first contact of the microelectronic component and the second exposed region includes a second contact of the microelectronic component, further comprising a first solder deposit at least partially received within an interior of the first dam and a second solder deposit at least partially received within an interior of the second dam.

8. The microelectronic component assembly of claim 1 wherein the encapsulant comprises a continuous layer.

9. The microelectronic component assembly of claim 1 wherein the encapsulant comprises a continuous layer of a dielectric resin.

10. The microelectronic component assembly of claim 1 wherein each of the dams has a height that is greater than a thickness of the encapsulant.

11. The microelectronic component assembly of claim 1 wherein each of the first and second dams has an upper end, the upper ends of the dams defining a plane generally parallel to the active surface.

12. The microelectronic component assembly of claim 1 wherein the first and second dams are two dams in an array of dams.

13. A microelectronic component assembly comprising:
   a microelectronic component carrying an array of contacts on an active surface;
   an array of spaced-apart dams carried by the active surface of the microelectronic component with a portion of the active surface of the microelectronic component being external to the dams, each of the dams being associated with and circumscribing an open contact volume associated with one of the contacts; and
   a dielectric material covering the portion of the active surface that is external to the dams, the dielectric material extending between the spaced-apart dams.

14. The microelectronic component assembly of claim 13 wherein all of the dams are formed of the same material.

15. The microelectronic component assembly of claim 13 wherein each of the dams is formed of a material that is different from the dielectric material extending between the dams.

16. The microelectronic component assembly of claim 13 wherein the dams are formed from a photoresist.

17. The microelectronic component assembly of claim 13 wherein the dielectric material is a first dielectric material and the dams are formed of a second dielectric material.

18. The microelectronic component assembly of claim 13 further comprising an array of solder deposits, at least a portion of each solder deposit being received in one of the open contact volumes.

19. The microelectronic component assembly of claim 13 wherein the dielectric material comprises a continuous layer.

20. The microelectronic component assembly of claim 13 wherein the dielectric material comprises a continuous layer of a dielectric resin.

21. The microelectronic component assembly of claim 13 wherein each of the dams has a height that is greater than a thickness of the encapsulant.

22. The microelectronic component assembly of claim 13 wherein each of the dams has an upper end, the upper ends of the dams defining a plane generally parallel to the active surface.

23. A method of manufacturing a microelectronic component assembly, comprising:
   depositing an array of spaced-apart dams on an active surface of a microelectronic component, each dam circumscribing a contact volume associated with one contact of an array of contacts carried by the microelectronic component;
   applying an encapsulant to the active surface of the microelectronic component by flowing the encapsulant between the dams, the encapsulant being applied at a thickness no greater than a height of the dams and leaving the contacts exposed; and depositing conductive structures in the contact areas on the contacts.

24. The method of claim 23 wherein the encapsulant is applied by wicking the encapsulant between the dams.

25. The method of claim 24 wherein the encapsulant is applied before the solder is deposited.

26. The method of claim 24 wherein the encapsulant comprises an underfill material, the encapsulant being applied after reflowing the solder.

27. The method of claim 23 wherein the encapsulant is applied by juxtaposing the surface of the microelectronic component with a mold surface such that outer ends of the dams engage the mold surface to limit flow of the encapsulant into the contact volumes.

28. The method of claim 23 wherein the encapsulant is applied before the solder is deposited.

29. The method of claim 23 wherein the microelectronic component is a first microelectronic component, further comprising reflowing the solder to connect the contacts on the first microelectronic component to contacts on a second microelectronic component.

30. The method of claim 23 wherein the solder mask is printed on the surface of the microelectronic component.

31. The method of claim 23 wherein the depositing the solder mask comprises depositing a monolithic layer of a solder mask and selectively removing solder mask to define the array of spaced-apart dams.

32. A microelectronic component assembly comprising:
a microelectronic component having a contact surface and an array of contacts on the contact surface;
an adhesive in contact with the contact surface of the microelectronic component; and
an uncured dielectric member formed of a curable, but uncured, dielectric, the dielectric member being attached to the contact surface of the microelectronic component by the adhesive and including an array of pre-formed contact openings through the dielectric material, the array of contact openings being registered with the array of contacts such that an associated one of the contacts is accessible through each of the contact openings.

33. The microelectronic component assembly of claim 32 wherein the dielectric member is UV curable.

34. The microelectronic component assembly of claim 32 wherein the dielectric member comprises a curable epoxy or a curable resin.

35. The microelectronic component assembly of claim 32 further comprising a dielectric fiducial carried by the dielectric member, the dielectric fiducial being positioned with respect to a component fiducial carried by the microelectronic component.

36. The microelectronic component assembly of claim 32 wherein each of the contact openings is smaller than its associated contact.

37. The microelectronic component assembly of claim 32 wherein the dielectric member has a confronting surface in contact with the adhesive and an outer surface oriented away from the microelectronic component, each contact opening extending through the dielectric member from the confronting surface to the outer surface.

38. The microelectronic component assembly of claim 32 wherein the dielectric member has a confronting surface in contact with the adhesive and an outer surface oriented away from the microelectronic component, each contact opening having a curved longitudinal profile.

39. The microelectronic component assembly of claim 32 further comprising a solder deposit in each of the contact openings.

40. The microelectronic component assembly of claim 32 further comprising a conductive structure in each of the contact openings, each of the conductive structures comprising a solder having a reflow temperature that is at least as great as a cure temperature of the uncured dielectric member.

41. The microelectronic component assembly of claim 32 wherein the microelectronic component comprises a semiconductor wafer that includes a plurality of semiconductor dies.

42. A microelectronic component assembly comprising:
a microelectronic component carrying an array of contacts;
a dielectric member having a confronting surface, an outer surface, and an array of contact openings, each of which extends from the confronting surface to the outer surface, the array of contact openings being registered with the array of contacts such that an associated one of the contacts is accessible through each of the contact openings, each contact opening having a restricted region and defining an associated anchor space between the restricted region and the microelectronic component, the restricted region of each contact opening having a restricted dimension less than a corresponding dimension of the associated anchor space;
an adhesive joining the dielectric member to the microelectronic component; and
an array of conductive structures, each conductive structure being partially received in one of the contact openings and being in electrical contact with the contact associated with the contact opening, an anchor portion of each of the conductive structures being disposed in the anchor space associated with the contact opening in which it is received and having a dimension greater than the restricted dimension of that contact opening.

43. The microelectronic component assembly of claim 42 wherein the dielectric member comprises a curable, but uncured, dielectric.

44. The microelectronic component assembly of claim 42 wherein the dielectric member comprises a UV-curable dielectric.

45. The microelectronic component assembly of claim 42 wherein the dielectric member comprises a heat-curable dielectric that is curable at a temperature no greater than a reflow temperature of the conductive structures.

46. The microelectronic component assembly of claim 42 wherein the dielectric member comprises a curable epoxy or a curable resin.

47. The microelectronic component assembly of claim 42 further comprising a dielectric fiducial carried by the dielectric member, the dielectric fiducial being positioned with respect to a component fiducial carried by the microelectronic component.

48. The microelectronic component assembly of claim 42 wherein the dielectric member has a confronting surface in contact with the adhesive and an outer surface oriented away from the microelectronic component, each contact opening extending through the dielectric member from the confronting surface to the outer surface.

49. The microelectronic component assembly of claim 42 wherein each contact opening has a curved longitudinal profile with a minimum dimension in the restricted region.

50. The microelectronic component assembly of claim 42 wherein each contact opening has a minimum dimension in the restricted region and wherein each anchor space comprises an expanded region of the associated contact opening, the expanded region being disposed between the restricted region of the associated contact opening and the microelectronic component.

51. The microelectronic component assembly of claim 50 wherein each expanded region tapers outwardly in a longitudinal direction toward the microelectronic component, defining a tapered shoulder associated with each of the contact openings.

52. The microelectronic component assembly of claim 42 wherein the restricted dimension of each contact opening is less than a corresponding dimension of the associated contact, defining a shoulder of the confronting surface adjacent each contact opening.

53. The microelectronic component assembly of claim 42 wherein the restricted dimension of each contact opening is less than a corresponding dimension of the associated contact, defining a shoulder of the confronting surface adjacent each contact opening, the anchor space comprising a space between the shoulder and the associated contact.

54. The microelectronic component assembly of claim 42 wherein each of the conductive structures comprises a solder.

55. The microelectronic component assembly of claim 42 wherein the dielectric member is formed of a curable, but uncured, dielectric and each of the conductive structures comprises a solder, the solder having a reflow temperature that is at least as great as a cure temperature of the uncured dielectric member.

56. The microelectronic component assembly of claim 42 wherein the microelectronic component comprises a semiconductor wafer that includes a plurality of semiconductor dies.

57. A method of manufacturing a microelectronic component assembly, comprising:
  juxtaposing a confronting surface of a preformed dielectric member with a contact surface of the microelectronic component;
  orienting the dielectric member with respect to the microelectronic component to register an array of contact openings extending through the dielectric member with an array of contacts on the contact surface of the microelectronic component;
  attaching the dielectric member to the microelectronic component such that an associated one of the contacts is accessible through each of the contact openings; and
  depositing a plurality of conductive structures on the array of terminals, each conductive structure being partially received in one of the contact openings.

58. The method of claim 57 wherein the dielectric member carries a dielectric fiducial and the microelectronic component carries a component fiducial, orienting the dielectric member with respect to the microelectronic device comprising positioning the dielectric fiducial with respect to the component fiducial.

59. The method of claim 57 wherein each of the conductive structures is formed of a solder or epoxy having a reflow temperature, further comprising heating the conductive structures to or above the reflow temperature.

60. The method of claim 57 wherein each of the conductive structures is formed of a solder or epoxy having a reflow temperature and the dielectric member comprises a curable dielectric, further comprising heating the conductive structures and the curable dielectric to reflow the conductive structures and cure the curable dielectric.

61. The method of claim 57 wherein the dielectric member comprises a curable dielectric, further comprising curing the dielectric.

62. The method of claim 57 wherein the dielectric member comprises a curable dielectric, further comprising curing the dielectric after depositing the conductive structures.

63. The method of claim 57 wherein a shoulder of the confronting surface of the dielectric member is associated with each of the contact openings, further comprising reflowing each of the conductive structures to engage the shoulder associated with the contact opening in which the conductive structure is received.

* * * * *

UNITED STATES PATENT AND TRADEMARK OFFICE
CERTIFICATE OF CORRECTION

PATENT NO. : 6,921,860 B2  Page 1 of 1
DATED : July 26, 2005
INVENTOR(S) : Darin L. Peterson et al.

It is certified that error appears in the above-identified patent and that said Letters Patent is hereby corrected as shown below:

Drawings,
Figure 15, " 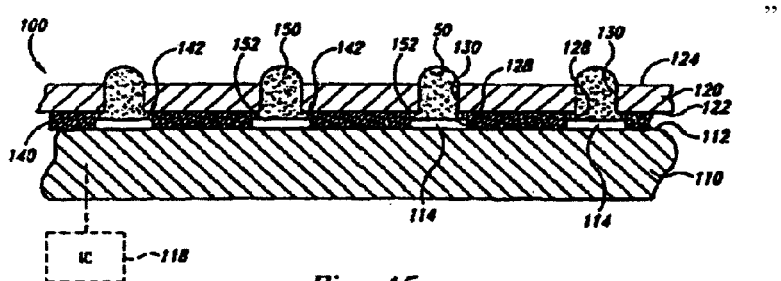 "

should be -- 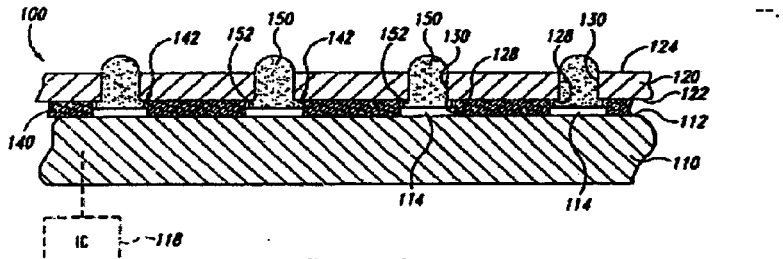 --.

Signed and Sealed this

Ninth Day of May, 2006

JON W. DUDAS
*Director of the United States Patent and Trademark Office*